US011233025B2

(12) United States Patent
Gu et al.

(10) Patent No.: US 11,233,025 B2
(45) Date of Patent: Jan. 25, 2022

(54) MERGED POWER PAD FOR IMPROVING INTEGRATED CIRCUIT POWER DELIVERY

(71) Applicant: Futurewei Technologies, Inc., Plano, TX (US)

(72) Inventors: Shiqun Gu, San Diego, CA (US);
Jinghua Zhu, Dongguan (CN);
Hongying Zhang, Shanghai (CN); Jun Xia, Shenzhen (CN); Wangsheng Xie, Shenzhen (CN); Shuangfu Wang, Shanghai (CN); Hong Liu, Shanghai (CN); Liming Zhao, Shanghai (CN);
Hongquan Sun, Beijing (CN)

(73) Assignee: Futurewei Technologies, Inc., Plano, TX (US)

( * ) Notice: Subject to any disclaimer, the term of this patent is extended or adjusted under 35 U.S.C. 154(b) by 122 days.

(21) Appl. No.: 15/880,451

(22) Filed: Jan. 25, 2018

(65) Prior Publication Data
US 2018/0350762 A1 Dec. 6, 2018

Related U.S. Application Data

(60) Provisional application No. 62/513,333, filed on May 31, 2017.

(51) Int. Cl.
*H01L 29/00* (2006.01)
*H01L 23/00* (2006.01)
(Continued)

(52) U.S. Cl.
CPC ............ *H01L 24/06* (2013.01); *H01L 21/486* (2013.01); *H01L 21/6835* (2013.01); *H01L 21/78* (2013.01); *H01L 23/293* (2013.01); *H01L 24/03* (2013.01); *H01L 24/11* (2013.01); *H01L 24/14* (2013.01); *H01L 24/81* (2013.01); *H01L 25/105* (2013.01); *H01L 25/50* (2013.01); *H01L 23/3128* (2013.01); *H01L 23/49811* (2013.01); *H01L 23/49816* (2013.01);
(Continued)

(58) Field of Classification Search
CPC ... H01L 21/486; H01L 21/6835; H01L 21/78; H01L 23/293; H01L 23/3128; H01L 24/03; H01L 24/06; H01L 24/11; H01L 24/81; H01L 25/0652; H01L 25/50; H01L 23/49811; H01L 24/14; H01L 24/17
USPC ........................................ 257/737, 773, 786
See application file for complete search history.

(56) References Cited

U.S. PATENT DOCUMENTS 7,928,576 B2 * 4/2011 Lin ....................... H01L 23/522
257/773
2009/0072398 A1 * 3/2009 Irsigler ............... H01L 23/5389
257/741

(Continued)

*Primary Examiner* — Nitin Parekh
(74) *Attorney, Agent, or Firm* — Vierra Magen Marcus LLP

(57) ABSTRACT

An integrated circuit package and a system including the integrated circuit package as well as a process for assembling the integrated circuit package are provided to improve integrated circuit power delivery. The integrated circuit package includes a first die having a plurality of pads formed in the first die and exposed on a top surface of the first die, at least one post on the first die, and a substrate including one or more redistribution layers. Each post in the at least one post spans at least two pads on the first die utilized for power distribution, and the first die is connected to the substrate via the at least one post.

13 Claims, 13 Drawing Sheets

(51) Int. Cl.
| | |
|---|---|
| *H01L 21/78* | (2006.01) |
| *H01L 23/29* | (2006.01) |
| *H01L 21/48* | (2006.01) |
| *H01L 25/00* | (2006.01) |
| *H01L 25/10* | (2006.01) |
| *H01L 21/683* | (2006.01) |
| *H01L 25/065* | (2006.01) |
| *H01L 23/498* | (2006.01) |
| *H01L 23/31* | (2006.01) |

(52) U.S. Cl.
CPC ...... *H01L 25/0652* (2013.01); *H01L 25/0655* (2013.01); *H01L 2221/68304* (2013.01); *H01L 2224/0231* (2013.01); *H01L 2224/0401* (2013.01); *H01L 2224/16227* (2013.01); *H01L 2224/48227* (2013.01); *H01L 2224/81005* (2013.01); *H01L 2225/1023* (2013.01); *H01L 2225/1035* (2013.01); *H01L 2225/1058* (2013.01)

(56) References Cited

U.S. PATENT DOCUMENTS

| | | | | |
|---|---|---|---|---|
| 2011/0074025 | A1* | 3/2011 | Yanase | H01L 24/94 257/737 |
| 2011/0215478 | A1* | 9/2011 | Yamamichi | H01L 24/19 257/773 |
| 2011/0285478 | A1* | 11/2011 | Nomura | C22C 30/02 333/239 |
| 2014/0203454 | A1* | 7/2014 | Tago | H01L 23/481 257/774 |
| 2014/0360768 | A1* | 12/2014 | Kang | H01L 23/49811 174/261 |
| 2015/0115464 | A1* | 4/2015 | Yu | H01L 21/486 257/774 |
| 2016/0027754 | A1* | 1/2016 | Katagiri | H01L 23/12 257/737 |
| 2016/0027758 | A1* | 1/2016 | Katagiri | H01L 24/13 257/737 |

\* cited by examiner

… (1)

MERGED POWER PAD FOR IMPROVING INTEGRATED CIRCUIT POWER DELIVERY

CROSS REFERENCE TO RELATED APPLICATIONS

This application claims the benefit of U.S. Provisional Application No. 62/513,333, titled "Merged Power Pad for Improving Integrated Circuit Power Delivery," filed May 31, 2017, the entire contents of which is incorporated herein by reference.

FIELD OF THE INVENTION

The present disclosure relates to integrated circuit packaging, and more particularly to merging solder bump sites for power distribution.

BACKGROUND

Fan-out wafer level packaging is a technology that enables a small footprint of an integrated circuit (IC) die to utilize a larger footprint of a chip carrier. For example, a small IC die footprint can be coupled to a much larger ball grid array (BGA) chip carrier package. Fan-out wafer level packaging is implemented by manufacturing a plurality of IC dies on a wafer substrate. The wafer is diced to separate the individual dies and then the dies are encapsulated in a polymer material such as an epoxy mold compound. The molded dies may be ground to expose a flat surface of the die encapsulated within the polymer material, and one or more redistribution layers (RDL) are formed using a semi-additive plating process. Each RDL may include electrical traces and/or vias that interface the small footprint of pads on the surface of the die with a larger footprint of the RDLs that includes pads of a different pitch, for example.

Conventional system-on-chip (SOC) or application processor (AP) packages may include multiple IC dies encapsulated in fan-out wafer level packaging stacked in a vertical manner and connected through various substrate layers, solder balls, and wire-bonding connections. As the electronic devices that utilize these SOC or AP packages get thinner, the total stack thickness of the SOC or AP package needs to be shrunk in order to fit in the form factors of the various electronic devices.

Current solutions to shrink the overall stack height have shrunk the RDL thickness to be about one third of the copper trace of a traditional laminate substrate chip carrier packaging. The thinner RDLs have enabled the package stack height to be shrunk to under 1 mm. However, the thinner RDLs increase the lateral sheet resistance (i.e., the ratio of resistivity to thickness based on a uniform current distribution of a conducting material) of the conductors in the RDLs. Increased lateral sheet resistance increases the voltage drop within the RDLs, which degrades circuit performance. Thus, it would be beneficial to implement solutions within the packaging technology to reduce voltage drop within the RDLs and/or other signal distribution structures within an integrated circuit package.

SUMMARY

An integrated circuit package and a system including the integrated circuit package as well as a process for assembling the integrated circuit package are provided to improve integrated circuit power delivery. The integrated circuit package includes a first die having a plurality of pads formed on the first die and exposed on a top surface of the first die, at least one post on the first die, and a substrate including one or more redistribution layers. A first post of the at least one post is constructed to span at least two pads on the first die utilized for power distribution, and the first die is connected to the substrate via the at least one post.

In a first embodiment, the at least two pads are associated with a first common node and are connected to a positive power supply of the first die, and a second post of the least one post spans two or more additional pads on the first die that are associated with a second common node and connected to a negative power supply of the first die.

In a second embodiment (which may or may not be combined with the first embodiment), the first die is encapsulated in a polymer material.

In a third embodiment (which may or may not be combined with the first and/or second embodiments), one or more additional posts formed on the substrate are encapsulated within the polymer material. A top surface of the integrated circuit package may be ground or polished to expose a top surface of the one or more additional posts.

In a fourth embodiment (which may or may not be combined with the first, second, and/or third embodiments), one or more additional packages are stacked on top of the integrated circuit package. Stacking the one or more additional packages on the integrated circuit package may be accomplished by placing the one or more additional packages on top of solder placed on the exposed top surface of the one or more additional posts.

In a fifth embodiment (which may or may not be combined with the first, second, third, and/or fourth embodiments), a positive power supply and a negative power supply are connected to at least one low-dropout (LDO) regulator included in the first die. A regulated voltage generated by the LDO regulator is distributed to a first voltage domain in the first die via a current path that exits the first die via a first pad coupled to the first post in the at least one post and re-enters the first die via a second pad coupled to the first post.

In a sixth embodiment (which may or may not be combined with the first, second, third, fourth, and/or fifth embodiments), the integrated circuit package is included in a system. The system further includes one or more additional packages stacked on top of the integrated circuit package, and a printed circuit board. The integrated circuit package is mounted to the printed circuit board.

In a seventh embodiment (which may or may not be combined with the first, second, third, fourth, fifth, and/or sixth embodiments), a process for assembling the integrated circuit package includes the steps of: forming a plurality of dies on a wafer; forming at least one post on a first die of the plurality of dies; and connecting, via the at least one post, the first die to a substrate including one or more redistribution layers (RDLs). Each die in the plurality of dies includes a plurality of pads formed on the die and exposed on a top surface of the die, and a first post of the at least one post is constructed to span at least two pads on the first die utilized for power distribution.

In an eighth embodiment (which may or may not be combined with the first, second, third, fourth, fifth, sixth, and/or seventh embodiments), the integrated circuit package is further assembled by placing solder on the exposed top surface of the one or more additional posts and stacking one or more additional packages on top of the IC package.

In a ninth embodiment (which may or may not be combined with the first, second, third, fourth, fifth, sixth, seventh, and/or eighth embodiments), connecting the first die to the substrate comprises: placing solder on the at least one post; placing the first die on the substrate; and reflowing the solder to connect the at least one post to the substrate.

In a tenth embodiment (which may or may not be combined with the first, second, third, fourth, fifth, sixth, seventh, eighth, and/or ninth embodiments), connecting the first die to the substrate comprises: encapsulating the first die in a polymer material; grinding a top surface of the integrated circuit package to expose a top surface of the at least one post; and forming the substrate by depositing the one or more RDLs on the top surface of the integrated circuit package utilizing a semi-additive plating process.

To this end, in some optional embodiments, one or more of the foregoing features of the aforementioned process, apparatus and/or system may afford an integrated circuit package that, in turn, may improve electrical characteristics of the integrated circuit package, such as by reducing lateral sheet resistance between a substrate and a die at merged bump sites. It should be noted that the aforementioned potential advantages are set forth for illustrative purposes only and should not be construed as limiting in any manner.

DETAILED DESCRIPTION

One solution to improve fan-out wafer level packaging is to merge multiple bumps associated with a common node used for power distribution at the center of the die, while maintaining the fine pitch of other bumps used for various signals at the periphery of the die. Most of the chip power will be drawn through these merged bump sites utilized for power distribution. Utilizing larger copper posts that span multiple pads at these merged bump sites reduces the lateral sheet resistance of the structure at the bump sites and spreads the power dissipation over a larger area, which will reduce the voltage drop at the bump sites used for power distribution. Copper post thickness is typically much larger than the RDL thickness and, therefore, the copper post will have a much lower lateral sheet resistance. In addition, the copper post is directly coupled to the chip, meaning any parasitic inductance introduced by the copper post will be low.

Figure 1:
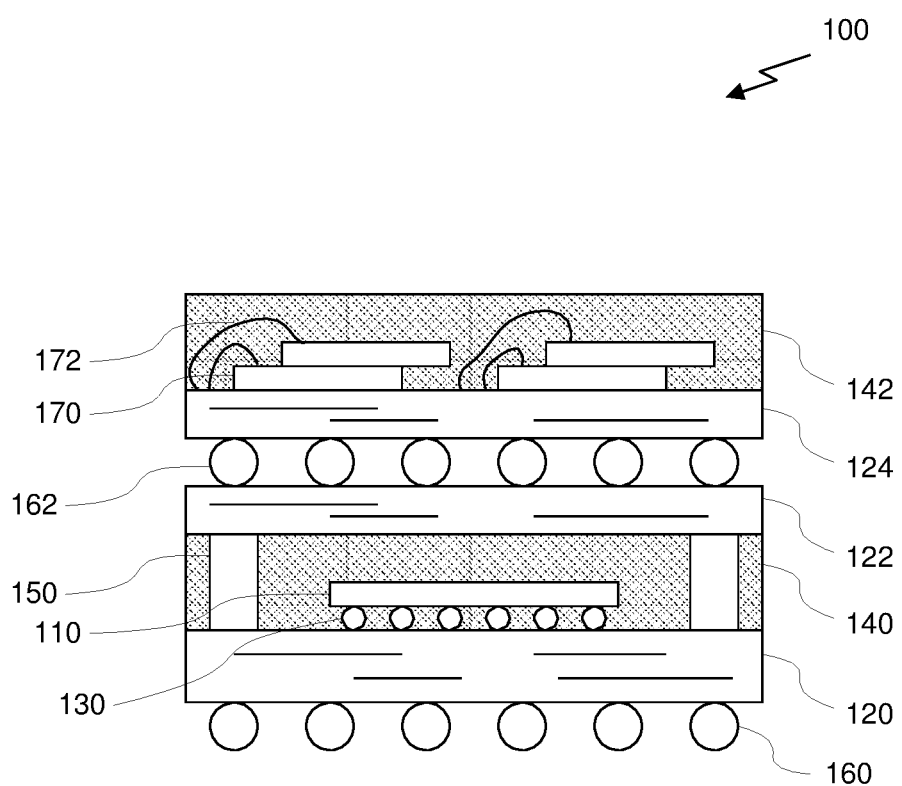
FIG. 1 illustrates an integrated circuit package in accordance with the prior art.

FIG. 1 illustrates an integrated circuit package 100, in accordance with the prior art. The IC package 100 is manufactured utilizing a package-on-package (POP) packaging technique that combines multiple dies into a single assembly. As shown in FIG. 1, a die 110 is coupled to a substrate 120 via solder 130. The substrate 120 may include a number of RDLs, each RDL including a number of conductive traces embedded in a dielectric material. The die 110 is placed on the substrate 120 and the solder is reflowed to connect the die 110 with the substrate 120. Then, the die 110 is encapsulated in a polymer material 140, such as a composite of an epoxy resin and fillers. The substrate 120 may be connected with another substrate 122 located on the opposite side of the die 110 via posts 150 formed in the polymer material 140. The posts 150 may be formed on the substrate 120 prior to encapsulating the die 110 in the polymer material 140, or the posts 150 may be formed in the polymer material 140 after encapsulation (e.g., by forming holes in the polymer material 140 and filling with the holes with a conductive material). The second substrate 122 includes RDLs that re-route signals from the locations of the posts 150 to various other locations on the opposite side of the second substrate 122.

The package for the die 110 is coupled to external devices via solder balls. A bottom of the package for the die 110 includes solder balls 160 for coupling the die 110 to, e.g., a printed circuit board. The top of the package for the die 110 includes additional solder 162 for coupling the die 110 to one or more additional packages in a stacked POP packaging technique. As shown in FIG. 1, the die 110 may be connected to additional dies 170 in one or more additional packages. The additional dies 170 may typically be memory devices such as DRAM modules, and may be connected to a substrate 124 via wirebonds 172 and encapsulated in polymer material 142. The package for the additional dies 170 is stacked on top of the package for the die 110, and connections are implemented via the solder 162 and substrate 124.

Figure 2:
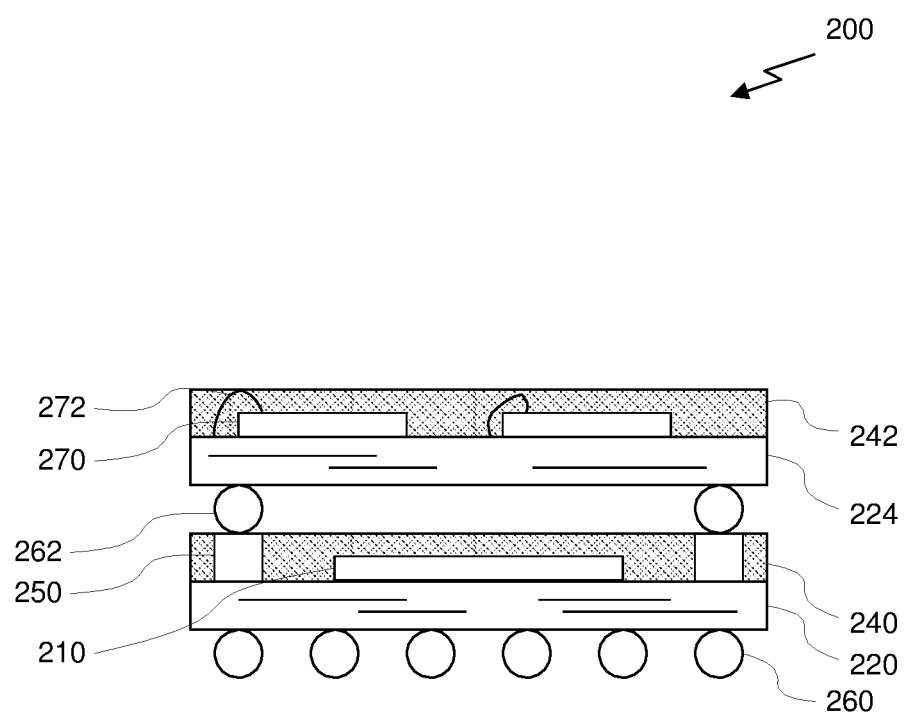
FIG. 2 illustrates an application processor package, in accordance with the prior art.

FIG. 2 illustrates an application processor (AP) package 200, in accordance with the prior art. The AP package 200 is thinner than the IC package 100. As shown in FIG. 2, the AP package 200 includes a die 210 encapsulated in polymer material 240. Unlike the substrate 120 in the IC package 100, the substrate 220 may be formed directly on the encapsulated die 210 using a semi-additive plating process. The substrate 220 may be thinner than substrate 120 because each RDL may be thinner in the substrate 220 than in the substrate 120. The posts 250 are utilized to route signals from the substrate 220 to a package placed on top of the package for the die 210.

Additional dies 270 are coupled to a substrate 224 via wirebonds 272, similarly to the additional dies 170 in IC package 100. The additional dies 270 are encapsulated in the polymer material 242. However, the solder 262 utilized to couple the signals from the additional dies 270 to the die 210 are located around the perimeter of the package 200 and coupled directly to the posts 250 rather than a separate and distinct substrate. This arrangement may limit the number of signals that can be routed between the pair of packages because posts 250 cannot pass directly through the die 210; however, the overall thickness of the AP package 200 is reduced by omitting a separate and distinct substrate on the top of the package for the die 210 as well as by reducing the thickness of the RDL.

Even though the AP package 200 is thinner than IC package 100, the lateral power distribution of AP package 200 may be limited. Reducing the thickness of the RDL layers in substrates 220 and/or 224 will increase a lateral sheet resistance of the conductive interconnects within those layers, which will increase the voltage drop when current travels through the interconnects.

Figure 3A:
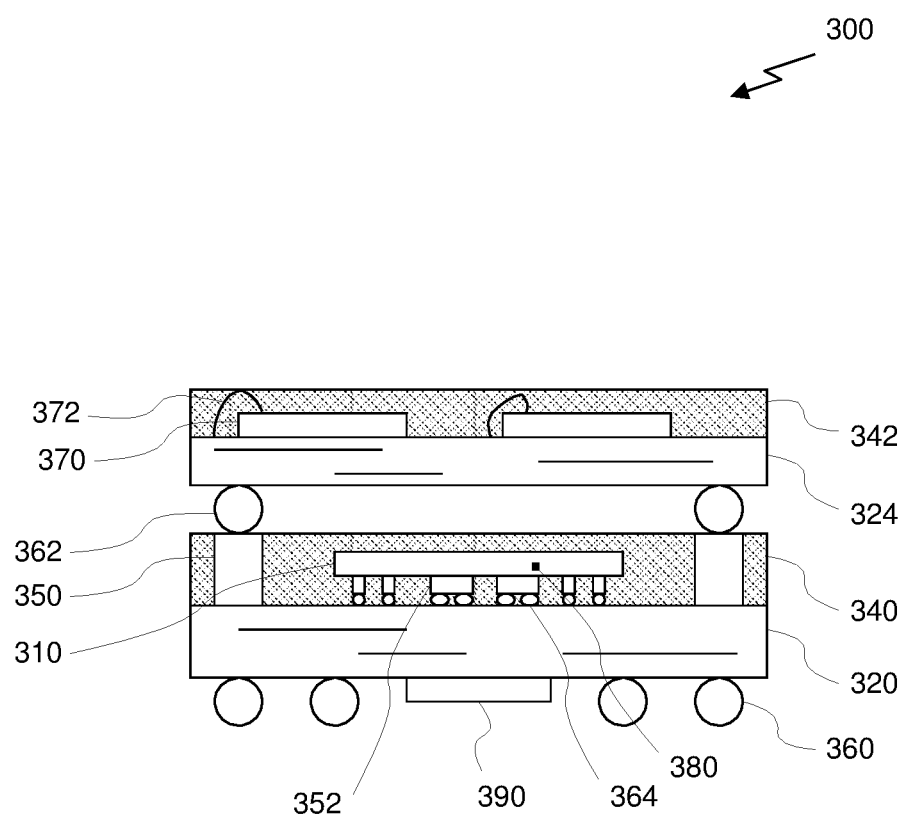
FIGS. 3A, 3B, and 3C illustrate an integrated circuit package, in accordance with one embodiment.
Figure 3B:
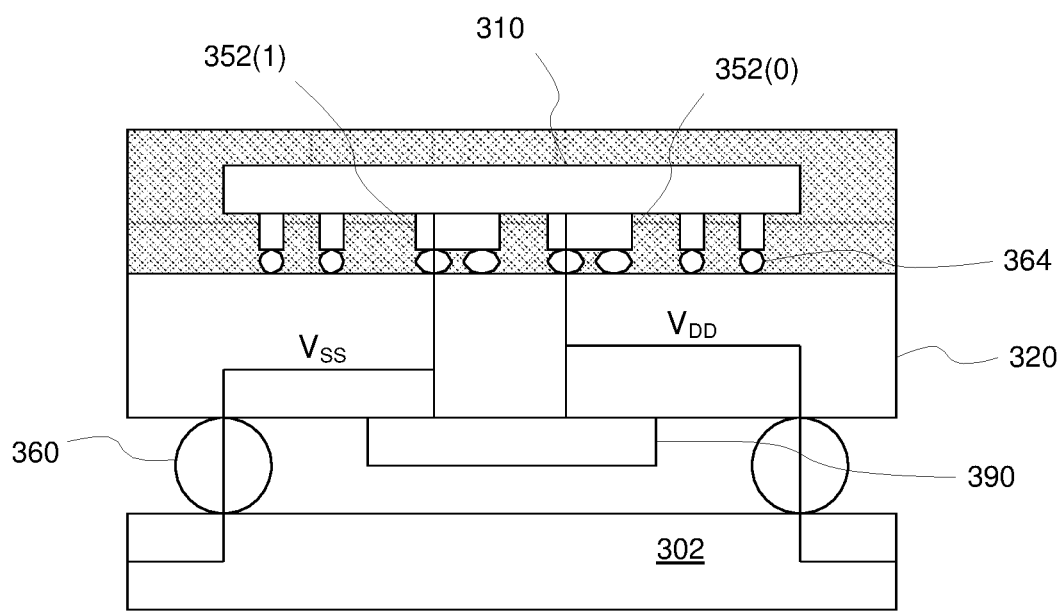
Figure 3C:
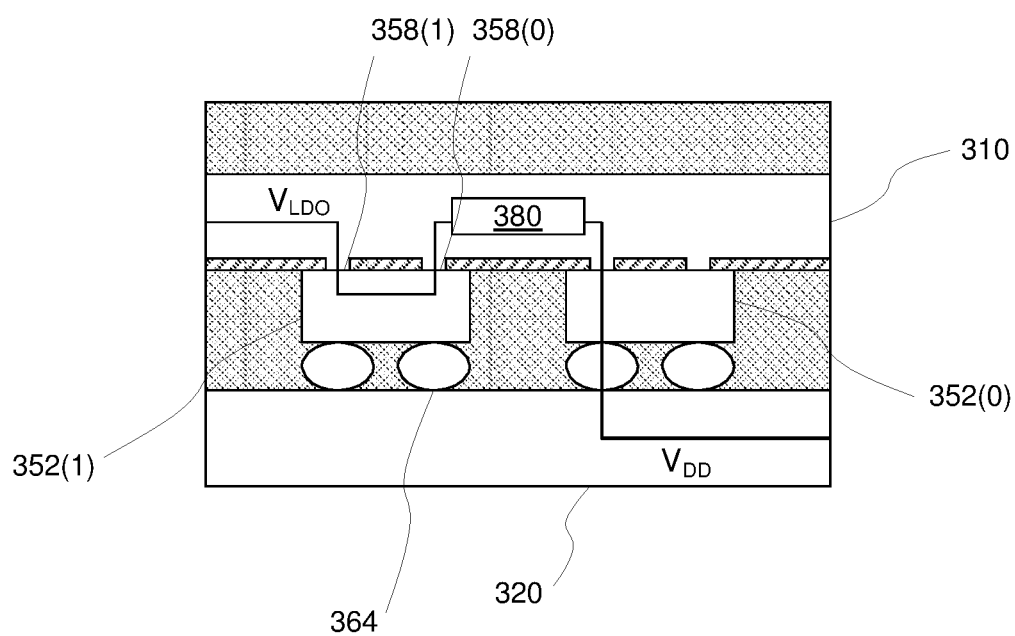

FIGS. 3A, 3B, and 3C illustrate an integrated circuit package 300, in accordance with one embodiment. More specifically, the die 310 of the integrated circuit package 300 includes at least two pads that are commonly connected to a single post 352 for receiving a voltage for power. As shown in FIG. 3A, the IC package 300 includes a die 310 encapsulated in polymer material 340. The die 310 is coupled to a substrate 320 at a number of bump sites. Again, the substrate 320 includes one or more RDLs and may be thinner than substrate 120 because each RDL in substrate 320 was formed utilizing a fine pitch semi-additive plating process. Posts 350 are utilized to route signals from the substrate 320 to one or more additional packages stacked on top of the package for the die 310. In one embodiment, the posts 350 are columns of conductive material such as a copper or copper alloy (e.g., Cu/Ni).

The die 310 is coupled to the substrate 320 via solder 364 formed on posts 352. In one embodiment, the posts 352 are columns of conductive material such as a copper or copper alloy (e.g., Cu/Ni). The posts 352 may be formed on a wafer having a plurality of dies 310 prior to dicing or, alternatively, may be formed on individual dies 310 mounted on a carrier after dicing. The solder 364 may be placed on top of posts 352 prior to attaching the die 310 to the substrate 320. In addition, in some embodiments, a coined solder 364 may be placed on the post 352 at the merged bump site. The solder 364 may be reflowed after the die 310 has been placed on the substrate 320 to attach the die 310 to the substrate 320. Alternatively, the solder 364 may be placed on the substrate 320 prior to attaching the die 310 to the substrate 320.

One or more additional dies 370 are coupled to a substrate 324 via wirebonds 372, similarly to the additional dies 170 in IC package 100 and the additional dies 270 in AP package 200. The additional dies 370 are encapsulated in polymer material 342. Solder 362 directly couple the posts 350 encapsulated in the polymer material 340 surrounding the die 310 to the substrate 324, routing the signals from the additional dies 370 to the die 310 via substrate 320.

Most of the current entering through these bumps sites will be passing through a handful of bump sites utilized for power distribution rather than the bulk of the bump sites used for other signals. One or more bump sites may be connected to a positive power supply (e.g., $V_{DD}$) and one or more additional bump sites may be connected to a negative power supply (e.g., $V_{SS}$), where the positive power supply and negative power supply may be distributed to various circuits within the die 310.

The negative effects of thin RDLs in substrate 320 can be alleviated by merging the connecting structures (e.g., posts 352 and/or solder 364) for multiple power distribution pads. More specifically, the posts 352 associated with the bump sites utilized for power distribution are constructed to span two or more separate pads on the die 310 associated with a common node (i.e., the pads are electrically connected in the die 310 such that they share the same electrical potential). In other words, after the die 310 has been manufactured with a number of pads utilized for power distribution, a semi-additive plating process may be utilized to form a post 352 that spans a plurality of pads on the die 310 associated with a common node. This single structure merges two or more conventional bump sites (i.e., locations where bumps were placed directly on individual pads) into a merged bump site spanning two or more pads. As used herein the term bump site may refer to any combination of one or more pads, a post, and/or solder forming conductive structure to interface a signal with the die 310. The cross-sectional area of the post 352 attached to the merged bump site is much larger than the area of a conventional bump for a single bump site. The larger cross-sectional area reduces the lateral sheet resistance of the post 352, thereby reducing the voltage drop realized when distributing power to the die 310 through the merged bump site.

In one embodiment, a power supply is coupled to the IC package 300 by connecting a positive power supply to at least one of the solder balls 360 connected to substrate 320 and a negative power supply to at least another one of the solder balls 360 connected to substrate 320. The path of current from the power supply passes through the solder balls 360, through one or more RDLs of the substrate 320, and then enters the die 310 via the merged bump sites.

In one embodiment, a decoupling capacitor 390 is coupled to the substrate 320 and the positive power supply and negative power supply are coupled to the decoupling capacitor 390 to decouple the die 310 from the rest of the electrical components coupled to the power supply. The decoupling capacitor 390 provides a dynamic, fast-response power to various macroblocks (i.e., logical groupings of related transistors or other integrated circuit elements) within the die 310 as macroblocks switch between a low-power or sleep state to an active state. When a macroblock transitions into an active state, transistors within the macroblock will start to switch and a large current demand may be created. Supply current from a printed circuit board coupled to the IC package 300 is limited due to a high parasitic inductance on the printed circuit board. The decoupling capacitor 390 is physically close to the die 310 and can provide the current to the die 310 quickly. The decoupling capacitor 390 can provide the current to the die 310 with a faster response and a lower voltage drop due to the merged bump site.

As shown in FIG. 3B, the positive power supply (e.g., $V_{DD}$) and the negative power supply (e.g., $V_{SS}$) may be routed from a printed circuit board 302 to the IC package 300 via solder balls 360. The positive power supply is routed, via one or more RDLs in substrate 320, to the decoupling capacitor 390 as well as to one of the a first merged bump site including post 352(0) and one or more solder 364. The negative power supply is routed, via one or more RDLs in substrate 320, to the decoupling capacitor 390 as well as to a second merged bump site including post 352(1) and one or more solder 364. The positive power supply and the negative power supply may be routed on separate RDLs in the substrate 320, and the order of RDLs may vary according to different designs. For example, a first RDL in the substrate 320 may be formed for routing the positive power supply, a second RDL in the substrate 320 may be formed for routing the negative power supply, and a third RDL in the substrate 320 may be formed for routing other signals coupled to the die 310. Additional RDLs may be placed between the power plane layers and the bump sites for the die 310.

In one embodiment, the current that is directed onto the die 310 through the merged bump sites can be coupled to one or more low-dropout (LDO) regulators 380 on the die 310. The LDO regulators 380 can convert the input voltage supplied to the die 310 to one or more different voltages (i.e., lower voltages) used by additional voltage domains on the die 310. A voltage domain refers to logic operating at a particular supply voltage. Power that enters the die at a first voltage via the merged bump sites or non-merged bump sites can be converted into a plurality of different voltage domains on the die 310.

As shown in FIG. 3C, in one embodiment, voltage generated by an LDO regulator 380 located on die 310 can be distributed from the LDO regulator 380 through a merged bump site. A positive power supply (e.g., $V_{DD}$) may enter the die 310 through a first bump site (either a merged bump site or a single bump site) including a first post 352(0). The LDO regulator 380 converts the positive power supply into a regulated voltage (e.g., $V_{LDO}$ that is lower than the input voltage) that is distributed to a particular voltage domain on the die 310. However, rather than distributing the regulated voltage to the particular voltage domain entirely within the die 310, part of the current path may pass through a second merged bump site including a second post 352(1). The current may exit the die 310 through a first pad 358(0) coupled to the second post 352(1) and then re-enter the die 310 through a second pad 358(1) coupled to the second post 352(1). The metal thickness within die 310 is typically very thin (e.g., <=1 μm of Copper), such that a significant voltage drop could result from distributing the regulated voltage to one or macroblocks in the particular voltage domain on the interconnects within the die 310. This voltage drop can be reduced by modifying this path such that the current passes through a merged bump site external to die 310 rather than following a path that is entirely contained within the die 310. By utilizing a merged bump site, the LDO regulator 380 may distribute the regulated voltage to other areas of the die 310 with a much lower voltage drop than conventional designs that are distributed entirely within the die 310.

Figure 4:
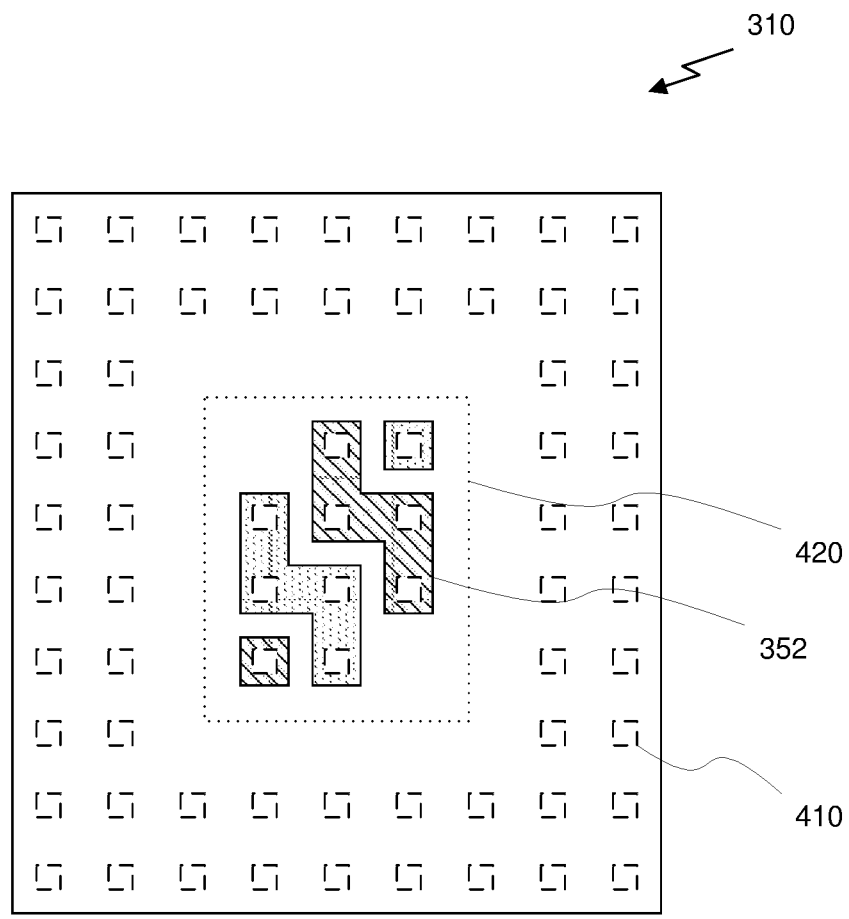
FIG. 4 is a plan view of the die of FIG. 3, in accordance with one embodiment.

FIG. 4 is a plan view of the die 310 of FIG. 3, in accordance with one embodiment. As shown in FIG. 4, the die 310 includes a plurality of pads 410 distributed on the surface of the die 310. Each pad 410 is a conductive structure formed in the die 310 and exposed on a top surface of the die 310. In one embodiment, the pads 410 are formed from copper, a copper alloy, or aluminum. Each of the pads 410 enable an electrical signal to be interfaced with the circuits implemented within the die 310. The pads 410 are shown as dashed squares that represent an area of the pad on the surface of the die 310. In some embodiments, the shape of each pad may be a polygon with between 4 and 72 sides.

The pads 410 include a plurality of pads that are used for power distribution. In one embodiment, the pads 410 utilized for power distribution are located in a central region 420 of the die 310. Each pad 410 utilized for power distribution is similar in structure to the other pads 410. Unlike the other pads 410 connected to various signals, the pads 410 utilized for power distribution are connected to a power supply for the die 310, which needs to be relatively stable (i.e., remain within some threshold amount of a nominal voltage while the die 310 is operating). For example, the die 310 may be connected to a positive power supply (e.g., $V_{DD}$) of 1.1 VDC and a negative power supply (e.g., $V_{SS}$) of 0 VDC (e.g., ground). Of course any operating voltages compatible with the die 310 may be connected to the pads 410 utilized for power distribution.

The resistance and inductance in the positive power supply path will reduce the level of the voltage applied to the transistor level logic. Reduction of $V_{DD}$ caused by IR drop will reduce the drive strength of the transistor. The resistance and inductance in the negative power supply path will increase the transistor ground voltage relative to true ground, which will result in an increased circuit leakage current. Therefore, it is important for inductance and resistance to be minimized within the power supply paths. Implementing merged bump sites for both the positive power supply and the negative power supply is critical for providing good power delivery to the transistor circuits.

It will be appreciated that multiple pads 410 associated with a common node are coupled to a single post 352 by forming the post 352 on the surface of the die 310 in a manner that the post 352 spans multiple pads 410. As shown in FIG. 4, four posts 352 are formed on the pads 410 utilized for power distribution. Two of the four posts 352 span a single pad 410, and two of the four posts 352 span four pads 410. A cross-hatched pattern represents posts 352 that are connected to a positive power supply voltage and a dot pattern represents posts 352 that are connected to a negative power supply voltage. A majority of the current drawn from the power supply will pass through the two posts 352 that each span four pads 410. Because the cross-section of these two posts 352 is larger than the cross-section of a post that only spans a single pad 410, these two posts 352 have a reduced lateral sheet resistance. Therefore, power dissipation due to a voltage drop across the posts 352 is reduced.

It will be appreciated that the shape of the posts may match a layout of the pads associated with a common node. For example, the shape of the posts may be a square that spans a 2×2 array of pads. Any shape that spans multiple pads is within the scope of this disclosure. However, care should be taken that the cross-sectional area of the post is designed to reduce a lateral sheet resistance of the post in order to reduce the voltage drop across the merged bump site.

Figure 5A:
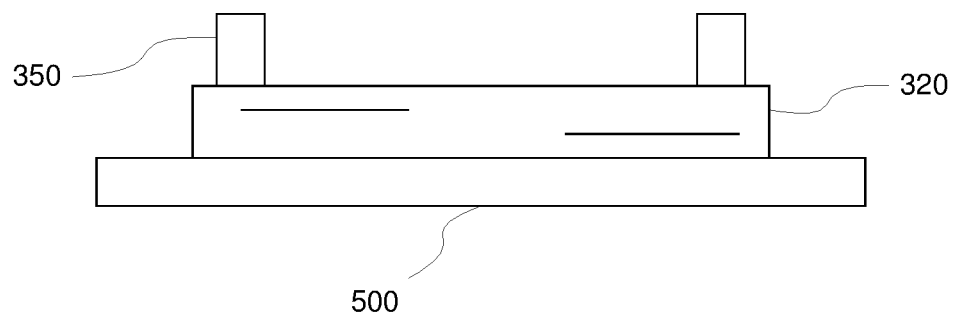
FIGS. 5A-5D illustrate a technique for fabricating the integrated circuit package of FIG. 3, in accordance with one embodiment.

FIGS. 5A-5D illustrate a technique for fabricating the IC package 300 of FIGS. 3A-3C, in accordance with one embodiment. As shown in FIG. 5A, the substrate 320 is formed on a carrier 500, and posts 350 are formed on the substrate 320, which will connect the substrate 320 to one or more additional packages stacked on top of the IC package 300. The carrier 500 may be a rigid material and is used as a stabilizing structure on which the substrate 320 is deposited during the assembly process. In one embodiment, the substrate 320 may be matched to multiple dies, which can then be separated into individual packages in a subsequent step.

Figure 5B:
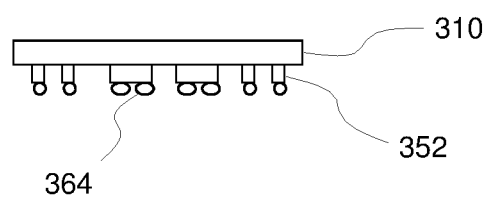

As shown in FIG. 5B, separately from creating the substrate 320 and posts 350 on the carrier 500, a plurality of dies 310 are formed on a wafer. Posts 352 are then formed on the dies 310, and the wafer is diced to separate each of the individual dies 310 having the posts 352 formed thereon. Solder 364 may then be placed on each of the posts 352 in order to prepare the die 310 for connecting to the substrate 320. In another embodiment, the solder 364 may be placed on the substrate 320 rather than on the posts 352, and coupled to the posts 352 during the reflow process described below.

Figure 5C:
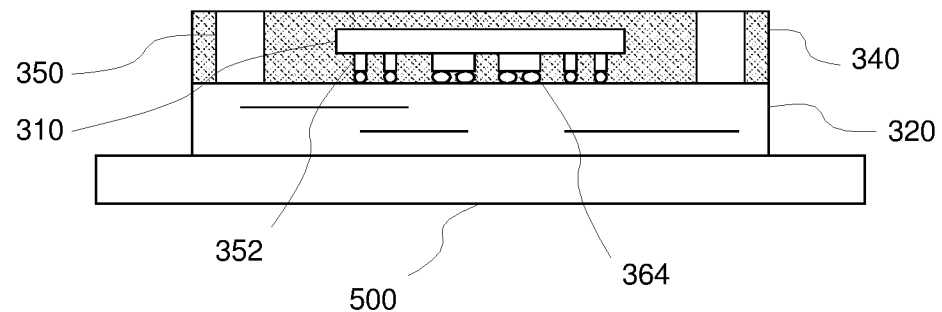

As shown in FIG. 5C, the die 310 is connected to the substrate 320. In one embodiment, the die 310 is placed on the substrate 320 with the posts 352 located between the die 310 and the substrate 320, and the assembly is heated to reflow the solder 364, connecting the posts 352 to corresponding pads formed on a surface of the substrate 320. The assembly is then molded to encapsulate the die 310, posts 352, melted solder 364, and posts 350 in a polymer material such as a composite of an epoxy resin and fillers. The assembly may then be ground and/or polished to create a flat surface on the top of the assembly and expose a flat surface of the top of the posts 350.

Figure 5D:
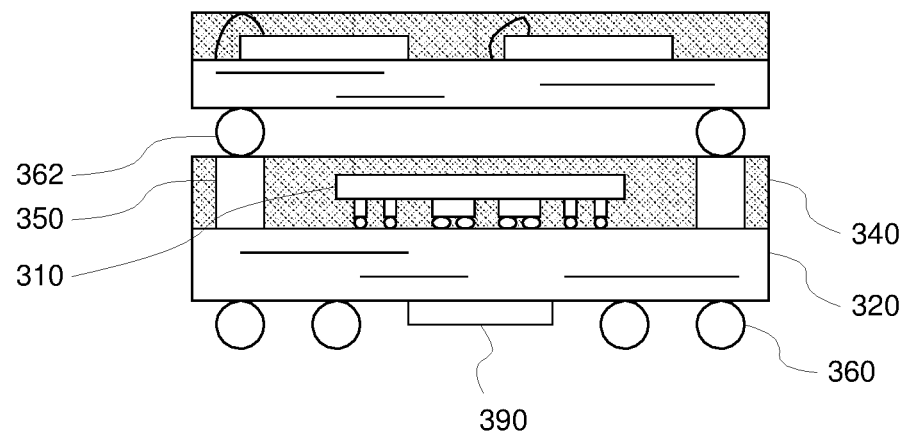

As shown in FIG. 5D, the carrier 500 is separated from the substrate 320, and solder balls 360 are connected to the substrate 320 and/or solder balls 362 are connected to posts 350. Optionally, a decoupling capacitor 390 may be coupled to the substrate 320. In addition, one or more other packages may be stacked on top of the IC package 300.

Figure 6:
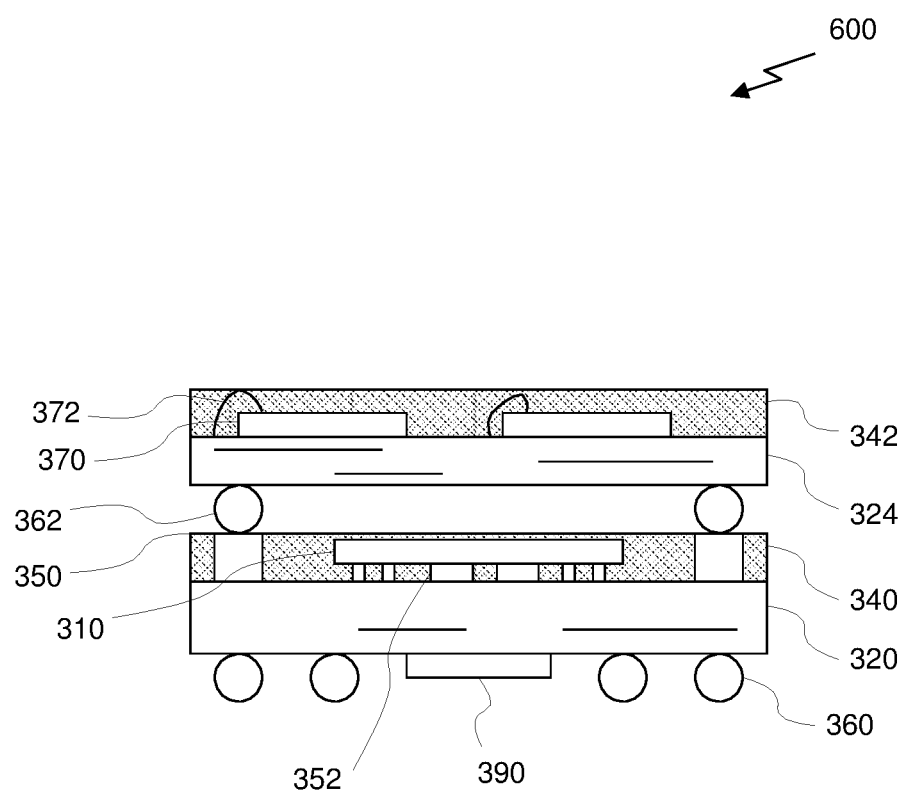
FIG. 6 illustrates an integrated circuit package, in accordance with another embodiment.

FIG. 6 illustrates an integrated circuit package 600, in accordance with another embodiment. In the IC package 300, the die 310 may be manufactured completely separately from the substrate 320, the die 310 and substrate 320 being connected using a solder reflow technique to melt solder placed on the posts 352 between the die 310 and the substrate 320. However, in IC package 600, as shown in FIG. 6, the substrate 320 may be formed directly on posts 352 using a semi-additive plating process, thereby omitting the solder 364 from the package 600 entirely. In all other aspects, the components and manufacturing techniques of IC package 300 and IC package 600 are similar.

Figure 7A:
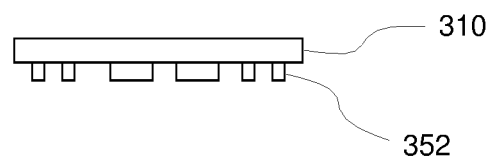
FIGS. 7A-7D illustrate a technique for fabricating the integrated circuit package of FIG. 3, in accordance with one embodiment.

FIGS. 7A-7D illustrate a technique for fabricating the IC package 600 of FIG. 6, in accordance with one embodiment. As shown in FIG. 7A, a plurality of dies 310 are formed on a wafer. Posts 352 are then formed on the dies 310, and the wafer is diced to separate each of the individual dies 310 having the posts 352 formed thereon.

Figure 7B:
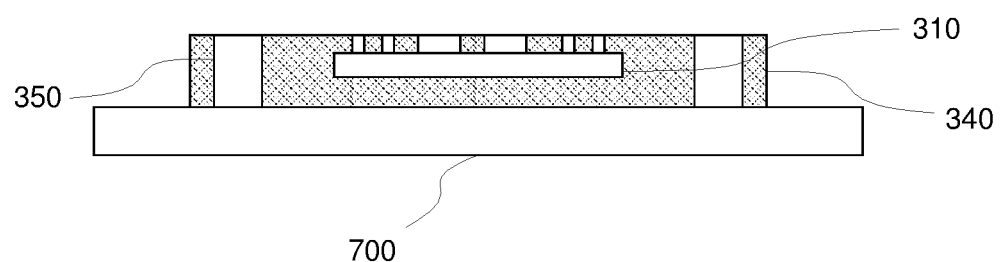

As shown in FIG. 7B, posts 350 may be formed on a carrier 700. In addition, a die 310 is flipped and placed on the carrier such that a top surface of the posts 350 and a top surface of the posts 352 formed on the die 310 are substantially co-planar. In one embodiment, a polymer material 340 is formed on the carrier 700 and holes are formed in the polymer material 340 at locations corresponding to the posts 350. The posts 350 are then formed by filling the holes with a conductive material such as copper or a copper alloy. The posts 350 may be increased in height above a surface of the polymer material by an additional height that substantially matches a combined height of the die 310 plus posts 352. The die 310 is then flipped and placed on the surface of the polymer material 340, and additional polymer material 340 is applied to the assembly to fully encapsulate the die 310 and posts 350. The top surface of the assembly may be ground and/or polished to form a flat surface where the top surface of posts 350 and posts 352 are co-planar.

Figure 7C:
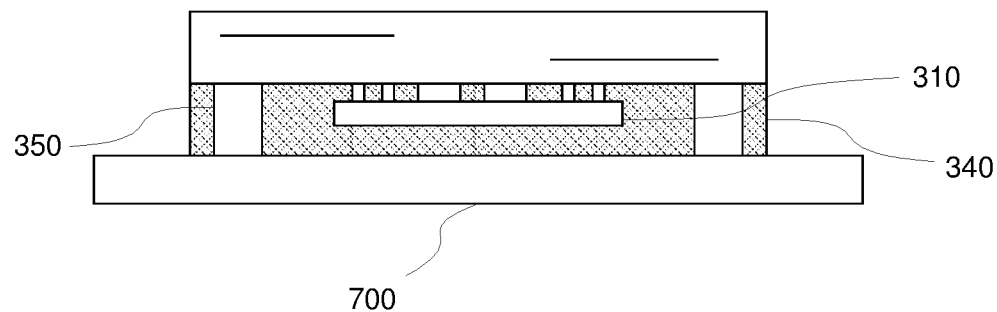

As shown in FIG. 7C, a substrate 320 is formed on a top surface of the assembly. The substrate 320 includes one or more RDLs that route signals from the die 310 to the posts 350 as well as pads on the opposite surface of the substrate 320. The substrate 320 may be formed directly on the ground/polished surface of the posts 350 and posts 352 using a semi-additive plating process such that no solder 364 is required to connect the die 310 to the substrate 320.

Figure 7D:
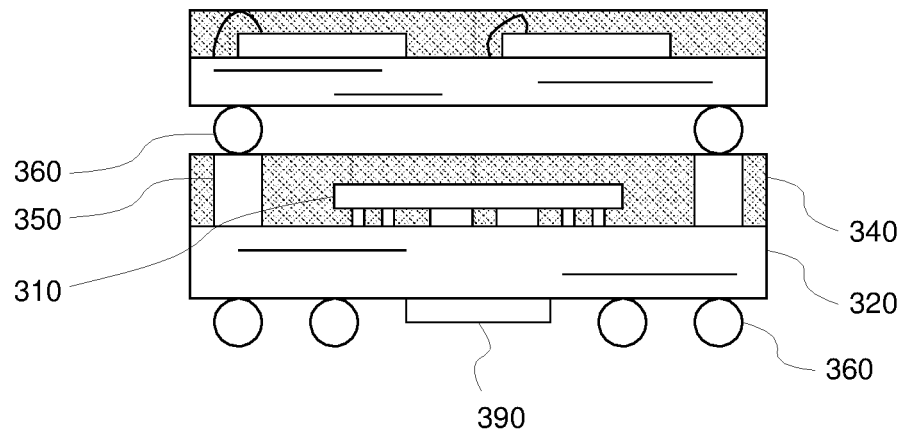

As shown in FIG. 7D, the carrier 700 is separated from the assembly including the die 310, substrate 320, and posts 350 encapsulated in the polymer material 340. Solder balls 360, solder 362, and, optionally, a decoupling capacitor 390 are connected to the substrate 320 and/or posts 350. In addition, one or more additional packages may be stacked on top of the IC package 300.

Figure 8:
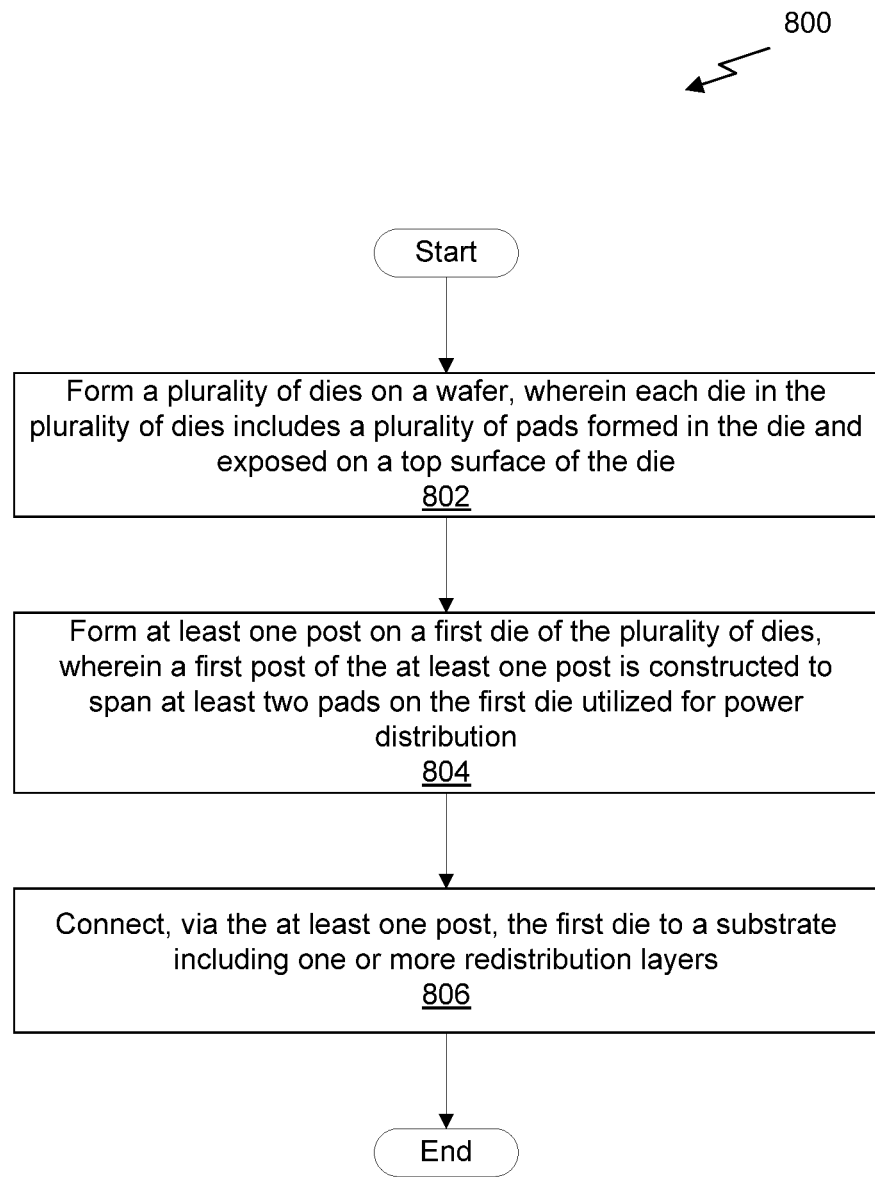
FIG. 8 is a flowchart of a method for assembling an integrated circuit package, in accordance with one embodiment.

FIG. 8 is a flowchart of a method 800 for assembling an integrated circuit package, in accordance with one embodiment. The method 800 may be performed by hardware, or a combination of hardware and software, on one or more specialized machines. In one embodiment, the method 800 is implemented, at least in part, by silicon wafer processing machinery and/or semi-additive plating process machinery.

At step 802, a plurality of dies are formed on a wafer. Each die includes a plurality of pads formed on the die and exposed on a top surface of the die. In one embodiment, the pads are utilized to interface external signals with the logic implemented in the die. The wafer may be made by a variety of integrated circuit manufacturing techniques well-known in the art.

At step 804, at least one post is formed on a first die of the plurality of dies, where a first post of the at least one post is constructed to span at least two pads on the first die that are utilized for power distribution. It will be appreciated that additional posts may also be formed on the first die in addition to the first post corresponding to pads utilized for power distribution. Furthermore, it will be appreciated that some posts corresponding to pads utilized for power distribution may only span a single pad, in addition to the posts corresponding to merged bump sites utilized for power distribution that span multiple pads. In one embodiment, the posts are formed on the die(s) via a semi-additive plating process prior to the wafer being diced to separate the individual dies from the wafer.

At step 806, the die is connected to a substrate including one or more redistribution layers (RDLs), via the at least one post. In one embodiment, solder is place on the posts formed on the die, the die is placed on the substrate, and a solder reflow technique is used to connect the posts to the substrate. In another embodiment, the die, with posts formed thereon, is encapsulated in a polymer material, a top surface of the molded die is ground and/or polished to expose a top surface of the posts, and the substrate is formed by depositing the one or more RDLs on the ground/polished surface of the molded assembly.

As a further optional step, solder is placed on the IC package and/or one or more additional packages may be stacked on top of the IC package. The solder may be placed on posts formed on the substrate or pads formed in the substrate and exposed on a surface of the substrate. At least some of the solder may be placed on the IC package during a first step, the one or more additional packages may be placed on the solder, and the solder may be reflowed to connect the additional packages to the IC package. Then, additional solder may be placed on the IC package during a second step to form a ball grid array or other mounting interface for mounting the IC package to a printed circuit board.

Figure 9:
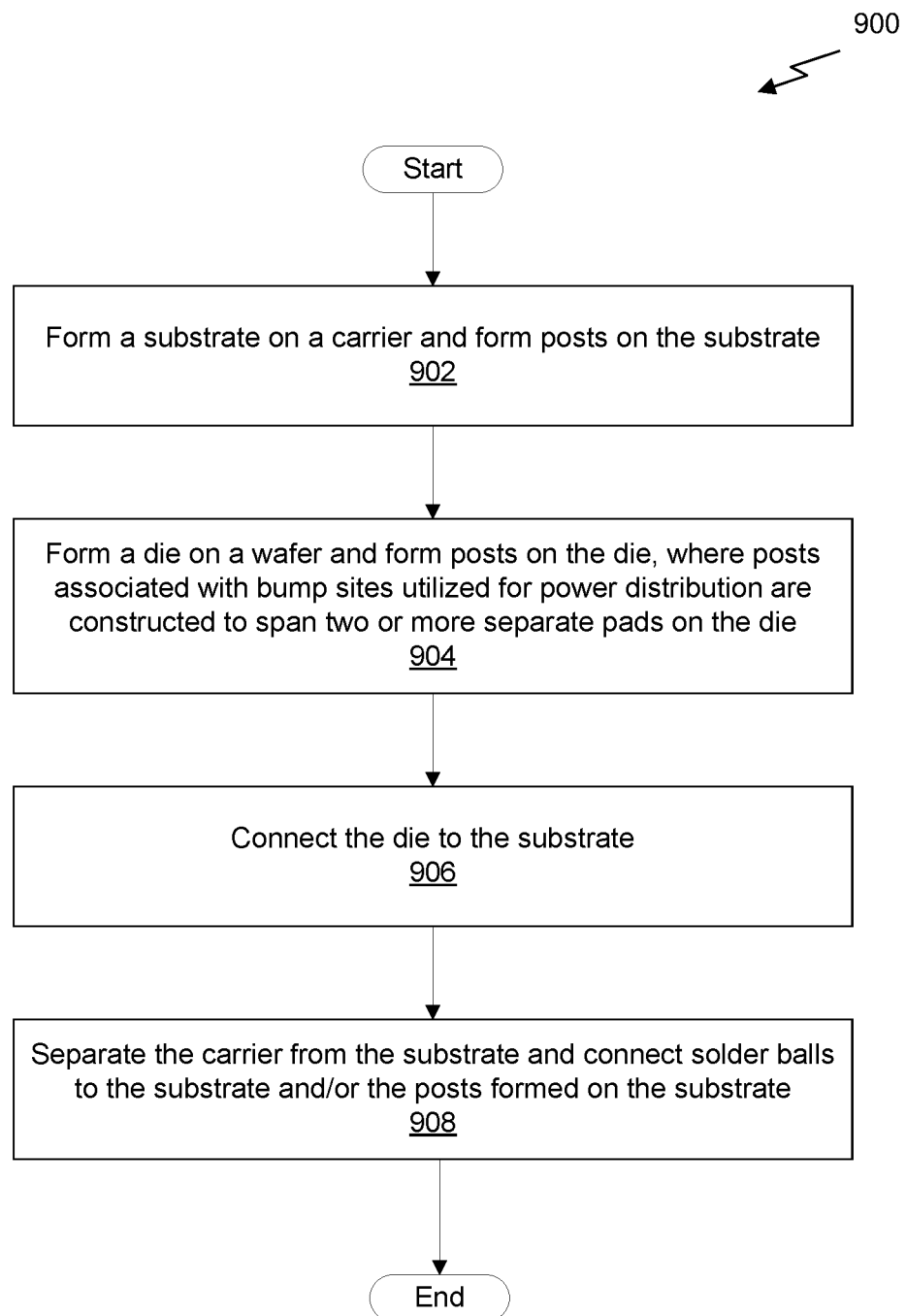
FIG. 9 illustrates an exemplary system in which the various architecture and/or functionality of the various previous embodiments may be implemented.

FIG. 9 illustrates a flowchart of a method 900 for assembling an integrated circuit package, in accordance with one embodiment. As referenced below, the method 900 may be performed in the context of the technique for fabricating the IC package described above with respect to FIGS. 5A-5D. The method 900 may be performed by hardware, or a combination of hardware and software, on one or more specialized machines. In one embodiment, the method 900 is implemented, at least in part, by silicon wafer processing machinery and/or semi-additive plating process machinery.

In step 902, a substrate 320 is formed on a carrier 500, and posts 350 are formed on the substrate 320, which will connect the substrate 320 to one or more additional packages stacked on top of an IC package 300 (e.g. as shown in FIG. 5A). The carrier 500 may be a rigid material and is used as a stabilizing structure on which the substrate 320 is deposited during the assembly process. In one embodiment, the substrate 320 may be matched to multiple dies, which can then be separated into individual packages in a subsequent step.

In step 904, separately from creating the substrate 320 and posts 350 on the carrier 500, a die 310 is formed on a wafer and posts 352 are then formed on the die 310 (e.g. as shown via single die 310 in FIG. 5B). The posts 352 associated with bump sites utilized for power distribution are constructed to span two or more separate pads on the die 310 associated with a common node (i.e., the pads are electrically connected in the die 310 such that they share the same electrical potential). The wafer is diced to separate each of the individual dies 310 having the posts 352 formed thereon. Solder 364 may then be placed on each of the posts 352 in order to prepare the die 310 for connecting to the substrate 320. In another embodiment, the solder 364 may be placed on the substrate 320 rather than on the posts 352, and coupled to the posts 352 during the reflow process described below.

In step 906, the die 310 is connected to the substrate 320 (e.g. as shown in FIG. 5C). In one embodiment, the die 310 is placed on the substrate 320 with the posts 352 located between the die 310 and the substrate 320, and the assembly is heated to reflow the solder 364, connecting the posts 352 to corresponding pads formed on a surface of the substrate 320. The assembly is then molded to encapsulate the die 310, posts 352, melted solder 364, and posts 350 in a polymer material such as a composite of an epoxy resin and fillers. The assembly may then be ground and/or polished to create a flat surface on the top of the assembly and expose a flat surface of the top of the posts 350.

In step 908, the carrier 500 is separated from the substrate 320, and solder balls 360 are connected to the substrate 320 and/or solder balls 362 are connected to posts 350 (e.g. as shown in FIG. 5D). Optionally, a decoupling capacitor 390 may be coupled to the substrate 320. In addition, one or more other packages may be stacked on top of the IC package 300.

It is noted that the techniques described herein, in an aspect, are embodied in executable instructions stored in a computer readable medium for use by or in connection with an instruction execution machine, apparatus, or device, such as a computer-based or processor-containing machine, apparatus, or device. It will be appreciated by those skilled in the art that for some embodiments, other types of computer readable media are included which may store data that is accessible by a computer, such as magnetic cassettes, flash memory cards, digital video disks, Bernoulli cartridges, random access memory (RAM), read-only memory (ROM), and the like.

As used here, a "computer-readable medium" includes one or more of any suitable media for storing the executable instructions of a computer program such that the instruction execution machine, system, apparatus, or device may read (or fetch) the instructions from the computer readable medium and execute the instructions for carrying out the described methods. Suitable storage formats include one or more of an electronic, magnetic, optical, and electromagnetic format. A non-exhaustive list of conventional exemplary computer readable medium includes: a portable computer diskette; a RAM; a ROM; an erasable programmable read only memory (EPROM or flash memory); optical storage devices, including a portable compact disc (CD), a portable digital video disc (DVD), a high definition DVD (HD-DVD™), a BLU-RAY disc; and the like.

It should be understood that the arrangement of components illustrated in the Figures described are exemplary and that other arrangements are possible. It should also be understood that the various system components (and means) defined by the claims, described below, and illustrated in the various block diagrams represent logical components in some systems configured according to the subject matter disclosed herein.

For example, one or more of these system components (and means) may be realized, in whole or in part, by at least some of the components illustrated in the arrangements illustrated in the described Figures. In addition, while at least one of these components are implemented at least partially as an electronic hardware component, and therefore constitutes a machine, the other components may be implemented in software that when included in an execution environment constitutes a machine, hardware, or a combination of software and hardware.

More particularly, at least one component defined by the claims is implemented at least partially as an electronic hardware component, such as an instruction execution machine (e.g., a processor-based or processor-containing machine) and/or as specialized circuits or circuitry (e.g., discreet logic gates interconnected to perform a specialized function). Other components may be implemented in software, hardware, or a combination of software and hardware. Moreover, some or all of these other components may be combined, some may be omitted altogether, and additional components may be added while still achieving the functionality described herein. Thus, the subject matter described herein may be embodied in many different variations, and all such variations are contemplated to be within the scope of what is claimed.

In the description above, the subject matter is described with reference to acts and symbolic representations of operations that are performed by one or more devices, unless indicated otherwise. As such, it will be understood that such acts and operations, which are at times referred to as being computer-executed, include the manipulation by the processor of data in a structured form. This manipulation transforms the data or maintains it at locations in the memory system of the computer, which reconfigures or otherwise alters the operation of the device in a manner well understood by those skilled in the art. The data is maintained at physical locations of the memory as data structures that have particular properties defined by the format of the data. However, while the subject matter is being described in the foregoing context, it is not meant to be limiting as those of skill in the art will appreciate that various acts and operations described hereinafter may also be implemented in hardware.

To facilitate an understanding of the subject matter described herein, many aspects are described in terms of sequences of actions. At least one of these aspects defined by the claims is performed by an electronic hardware component. For example, it will be recognized that the various actions may be performed by specialized circuits or circuitry, by program instructions being executed by one or more processors, or by a combination of both. The description herein of any sequence of actions is not intended to imply that the specific order described for performing that sequence must be followed. All methods described herein may be performed in any suitable order unless otherwise indicated herein or otherwise clearly contradicted by context.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the embodiments as claimed.

The embodiments described herein include the one or more modes known to the inventor for carrying out the claimed subject matter. It is to be appreciated that variations of those embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An integrated circuit (IC) package, comprising:
    a die that includes a plurality of pads, each of the plurality pads formed in the die and exposed on atop surface of the die;
    at least one post formed over the top surface of the die, wherein a first post of the at least one post is constructed to span and couple to at least two of the plurality pads on the die and is configured to be coupled to a power supply for power distribution; and
    a substrate including one or more redistribution layers (RDLs), wherein the die is connected to the substrate via the first post.

2. The IC package of claim 1, wherein the power supply includes a positive and a negative power supply, wherein the at least two pads are associated with a first common node and are connected to the positive power supply of the die, and wherein a second post of the least one post spans two or more additional pads on the die that are associated with a second common node and connected to the negative power supply of the die.

3. The IC package of claim 1, wherein the die is encapsulated in a polymer material.

4. The IC package of claim 3, wherein one or more additional posts formed on the substrate are encapsulated within the polymer material.

5. The IC package of claim 4, wherein one or more additional packages are stacked on top of the IC package.

6. The IC package of claim 1, wherein the power supply comprises at least one of a positive power supply and a negative power supply which are connected to at least one low-dropout (LDO) regulator included in the die, and wherein a regulated voltage generated by the LDO regulator is distributed to a first voltage domain in the die via a current path that exits the first die via a first pad coupled to the first post in the at least one post and re-enters the die via a second pad coupled to the first post.

7. A system, comprising:
    an integrated circuit (IC) package including:
        a die that includes a plurality of pads, each of the plurality of pads formed on in the die and exposed on a top surface of the die,
        at least one post formed over the top surface of the die, wherein a first post of the at least one post is constructed to span and couple to at least two of the plurality of pads on the die, and is configured to be coupled to a power supply for power distribution, and
        a substrate including one or more redistribution layers (RDLs), wherein the die is connected to the substrate via the first post.

8. The system of claim 7, wherein the power supply includes a positive and a negative power supply, wherein the at least two pads are associated with a first common node and are connected to the positive power supply of the die, and wherein a second post of the at least one post spans two or more additional pads on the die that are associated with a second common node and that are connected to the negative power supply of the die.

9. The system of claim 7, further comprising:
    one or more additional packages stacked on top of the IC package; and
    a printed circuit board, wherein the IC package is mounted to the printed circuit board.

10. The system of claim 7, wherein the die is encapsulated in a polymer material.

11. The system of claim 10, wherein one or more additional posts formed on the substrate are encapsulated within the polymer material.

12. The system of claim 11, wherein one or more additional packages are stacked on top of the IC package.

13. The system of claim 7, wherein the power supply includes at least one of a positive power supply and a negative power supply which are connected to at least one low-dropout (LDO) regulator included in the die, and wherein a regulated voltage generated by the LDO regulator is distributed to a first voltage domain in the die via a current path that exits the die via a first pad coupled to the first post in the at least one post and re-enters the die via a second pad coupled to the first post.

* * * * *

UNITED STATES PATENT AND TRADEMARK OFFICE
CERTIFICATE OF CORRECTION

| | |
|---|---|
| PATENT NO. | : 11,233,025 B2 |
| APPLICATION NO. | : 15/880451 |
| DATED | : January 25, 2022 |
| INVENTOR(S) | : Gu et al. |

It is certified that error appears in the above-identified patent and that said Letters Patent is hereby corrected as shown below:

In the Claims

• Column 13, Line 24 (Claim 1, Line 3): please replace "on atop surface" with -- on a top surface --

Signed and Sealed this
Twenty-sixth Day of April, 2022

Katherine Kelly Vidal
*Director of the United States Patent and Trademark Office*